United States Patent [19]

Ong

[11] 4,393,476
[45] Jul. 12, 1983

[54] RANDOM ACCESS MEMORY DUAL WORD LINE RECOVERY CIRCUITRY

[75] Inventor: Warren R. Ong, Cupertino, Calif.

[73] Assignee: Fairchild Camera & Instrument Corp., Mountain View, Calif.

[21] Appl. No.: 282,767

[22] Filed: Jul. 13, 1981

[51] Int. Cl.³ .............................................. G11C 11/40
[52] U.S. Cl. ...................................... 365/203; 365/189
[58] Field of Search ........................ 365/189, 203, 230

[56] References Cited

U.S. PATENT DOCUMENTS 4,368,529  1/1983  Furuyama ......................... 365/203

Primary Examiner—Terrell W. Fears

Attorney, Agent, or Firm—Kenneth Olsen; Warren M. Becker; Theodore Scott Park

[57] ABSTRACT

A discharge circuit for rapidly discharging the word lines of random access memories to thereby prevent erroneous reading from or writing into the memory during periods when the word lines are in a mid-state transition between selected and deselected voltage levels. Each discharge circuit associated with the memory word lines includes a transistor that is conductive only when a full select voltage level is applied to the word line and which controls conduction of a second multi-collector transistor coupled between top and bottom lines of a word line pair and a current source to discharge the word line pair during the mid-state transition period and to thus increase the speed capabilities of the memory.

7 Claims, 3 Drawing Figures

RANDOM ACCESS MEMORY DUAL WORD LINE RECOVERY CIRCUITRY

TECHNICAL FIELD

This invention relates to random access memories for digital computers or the like and particularly to word line recovery circuitry for rapidly discharging deselected word lines for preventing the accidental rewriting into a memory cell and for permitting faster operation of the memory.

BACKGROUND ART

Random access memories, usually called RAMS or direct access memories, are extensively used in virtually all digital computing equipment for the temporary storage of binary information which may be rapidly retrieved directly without first searching through a large volume of irrelevant data. There are several types of RAMs, the most popular being the bipolar memory because it is one of the fastest memories presently available. A bipolar RAM may be described as a matrix of a large quantity of individual transistor memory cells with vertical columns or cells interconnected by bit lines and horizontal rows of cells connected between top and bottom word lines which enable a row of memory cells by the application of a high select voltage to the top word line and which, via the bottom word line, provides a current path to a suitable current source or sink. Thus, any cell in the memory matrix may be identified as being at the junction of a particular bit line pair and a particular word line pair.

A selected cell is normally read by selecting and raising the voltage on the top word line and maintaining the voltage on the bit line pair at a constant level. The cell may be then read by sensing the presence or absence of current in one of the bit line pairs because of the on or off state of the memory cell transistor connected to that particular bit line.

Writing into a particular cell is accomplished by similarly raising the voltage on the top word line to which the selected cell is coupled and by lowering the voltage on one bit line to turn on the transistor connected to that bit line. Because a good fast random access memory must be rapidly switched, the particular top word line associated with a cell selected to be read or written into must be switched to its high state very rapidly and for a very short period of time while the sense amplifier coupled to the bit lines rapidly extracts the data from the selected cell at the junction of that bit line and word line. This very rapid switching between word lines presents serious problems which are solved by the circuitry of the present invention.

When a selected word line is suddenly deselected, the voltage on the top word line must be rapidly lowered to its low state. If the voltage is permitted to bleed off gradually, the memory cells associated with that line may accidentally be read or written into by the next read/write operation of an entirely different cell. That is, a selected cell with the high enabling voltage on its top word line may, when deselected, be in transition through a mid-state at the time a different word line is switched to its high selected state to read from or write into a different cell. In very many instances, a cell in its mid-state is erroneously read or written into. In order to avoid such errors, the memory should be operated at a slower rate to permit the deselected word line to recover to its low state.

This invention is for circuitry coupled between the word lines and current sources for very rapidly discharging all de-selected word lines to thereby shorten the time each cell passes through its mid-state transition to prevent an accidental reading or writing of a deselected cell and thereby permitting the memory to be operated at a faster rate.

DISCLOSURE OF THE INVENTION

Briefly described, the dual word line recovery circuitry of the invention includes a dual compare/inhibit circuit connected between each word line pair and a current source. The compare circuitry determines which word line may be in its high selected state. If a word line is in a mid-state following deselection or selection, the compare circuitry will locate that word line and close the transistor switch between both top and bottom word lines and a current source to thereby rapidly discharge the word line. When the word line pair is in its low deselect state, the recovery circuit is off. Aside from improving the word line recovery time, the circuitry of the invention increases the stability of the memory during transients by increasing the cell voltage swing of the word line in transient, thus improving the noise immunity of the transient cells during this critical mid-state period.

While the recovery circuitry is explained in connection with a bipolar RAM, the invention may be applied to any circuitry where one line is always high in an array of lines to aid in recovering that higher line. Specifically, the invention is well suited to recover word lines in a memory array such as those found in RAMs and programmable read-only memories and is most important for the fast recovery of word lines carrying low quiescent power.

BRIEF DESCRIPTION OF THE DRAWINGS

In the drawings which illustrate the preferred embodiment of the invention.

BEST MODE OF CARRYING OUT THE INVENTION

Figure 1:
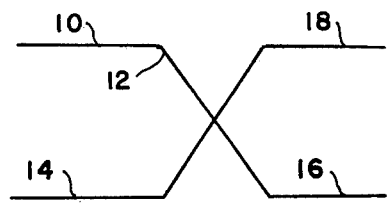
FIG. 1 is an ideal voltage time plot of selection and deselection of memory word lines.

FIG. 1 is a voltage-time plot of an ideal random access memory word line select and deselect transition. During the reading from or writing into a memory, one row of cells is enabled by the application of a high select voltage 10 to the top word line by a suitable word line driver circuit. When that word line is deselected as shown by the reference numeral 12 and another top word line is selected as shown by the numeral 14, it is most desirable that the voltage on the top word line thus deselected will rapidly drop to its low deselect level 16 and the newly selected line rides rapidly to its high select level 18.

Figure 2:
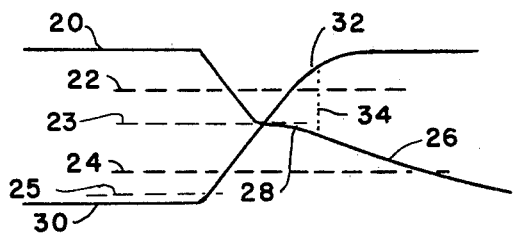
FIG. 2 is a voltage time diagram of typical prior art selected and deselected word lines.

Unfortunately the existing prior art circuitry cannot follow the ideal switching characteristics illustrated in the voltage-time plot of FIG. 1, and because of the inability to rapidly discharge the top and bottom word lines and their associated circuitry, the switching characteristics may appear as illustrated in FIG. 2. In FIG. 2 a select word line in its high selected state 20 will start a sharp voltage decline upon deselection but during transition through the mid-state region, between the dashed lines 22 and 24 of FIG. 2, the voltage will start a slow decay as shown by the numeral 26, and in many circuits may even temporarily level off in the mid-state as shown by the numeral 28. Now, if a bit line voltage were lowered to write into a selected cell in the word line displaying the voltage characteristics during the decreasing rise time 32, it is quite possible that the deselected cell coupled to that bit line but in transition down through the mid-state and following the curve at 28 at the approximate position of the dotted vertical line 34, may be sufficiently high to allow the cell to be rewritten in error. To avoid such error it has heretofore been necessary to slow the read/write cycle to permit the settling of the word line voltage levels.

Figure 3:
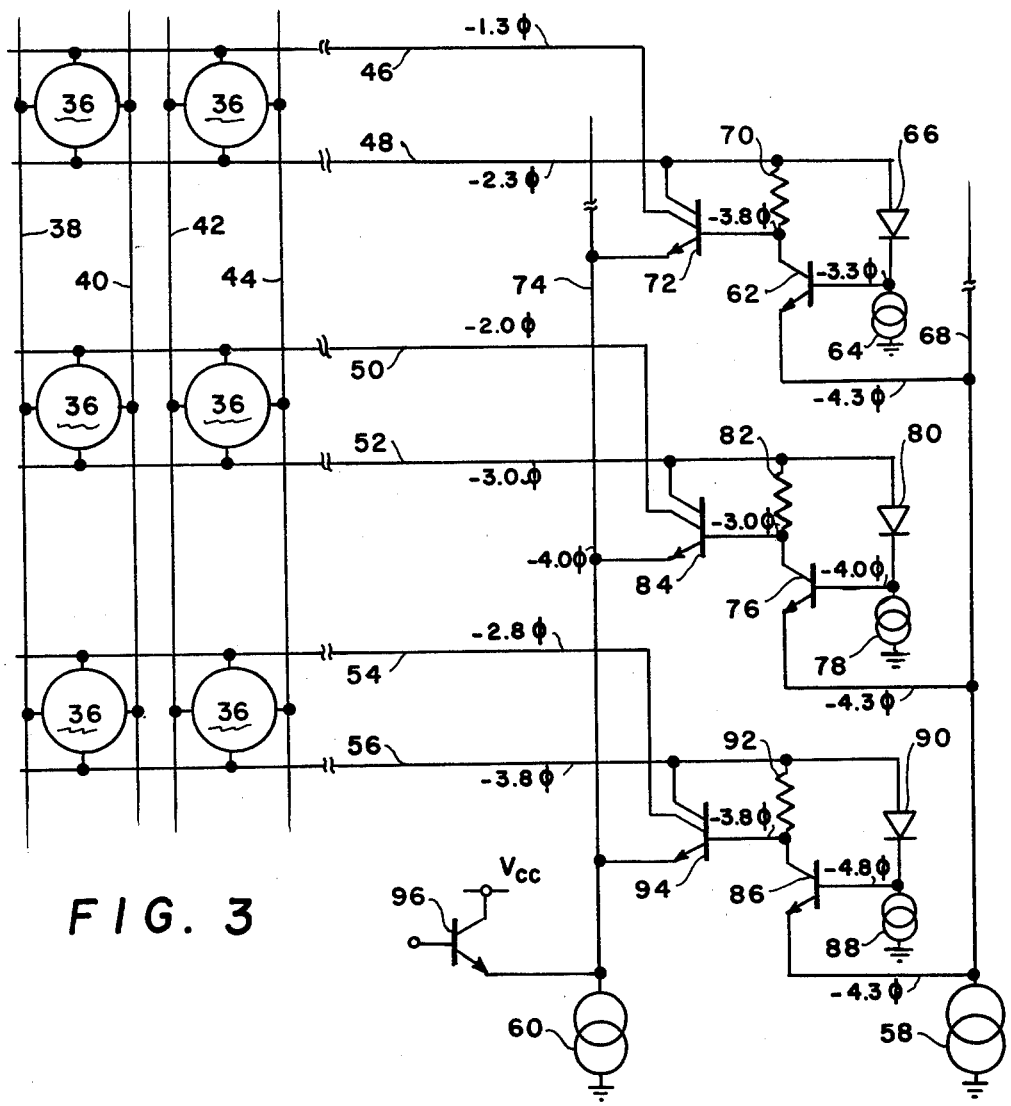
FIG. 3 is a schematic diagram of a small section of memory matrix employing the recovery circuitry of the invention.

The circuitry of FIG. 3 operates to rapidly discharge both top and bottom word lines and their associated circuitry so that word line when deselected will rapidly pass through the mid-state transition to thereby improve the word line recovery time and increase the stability of the memory.

FIG. 3 includes a block diagram illustrating a small portion of a memory matrix and a schematic diagram of the word line recovery circuitry of the invention. The memory matrix includes a plurality of memory cells 36 arranged in columns between bit line pairs 38, 40, and 42,44 and in rows between top and bottom word lines 46-48, 50-52, and 54-56. During the reading from or the writing into the memory, one top word line is selected by a select circuit (not shown) and the voltage thereon is raised to a level above the normal unaddressed voltage level.

For convenience, base to emitter voltage, $V_{be}$, will hereinafter be referred to in both the specifications and the drawings by the letter Phi, $\phi$, which has a value of approximately 0.75 volts for bipolar transistors and diode forward voltages. The voltages recited herein and shown in FIG. 3 may obviously be related to any convenient reference level and, in the preferred embodiment herein, all levels are indicated at voltages below the system $V_{cc}$ level. If it is assumed that the top word line 46 is selected and the voltage thereto will be $-1.3\phi$ below $V_{cc}$ reference, the bottom word line 48 will therefore be dropped by the $V_{be}$ of transistors in the memory cells to the level of $-2.3\phi$ below $V_{cc}$ reference.

It is assumed further that the lower word line pair 54-56 in FIG. 3 is in a deselected state and, to maintain unaddressed standby power through all cells associated with the word lines 54-56, the top word line 54 is maintained at the deselected level of $-2.8\phi$ so that the bottom word line 56 will be at a level of $-3.8\phi$ below reference.

Word lines 50-52 are assumed to be in a mid-state transition, either being selected or deselected, and the top word line 50 may carry a voltage of $-2.0\phi$ at the instant being considered so that the bottom word line 52 will carry a voltage of $-3.0\phi$.

The word line recovery circuitry includes a dual compare/inhibit circuit connected to each word line of the memory and to two current sources 58 and 60. All compare/inhibit circuits are identical. The circuitry associated with word lines 46-48 includes an NPN transistor 62, the base of which is coupled to a voltage circuit which preferably includes a current source 64 connected between ground reference and the cathode of a diode 66, the anode of which is connected to the bottom word line such as the bottom word line 48. The emitter of transistor 62 is connected to a conductor 68 which is coupled to ground reference through the current source 58. The collector of transistor 62 is coupled through a resistance 70 to the bottom word line 48 and to the base of a dual-collector transistor 72. Transistor 72 may be an identical pair of NPN transistors with interconnected bases and interconnected emitters coupled to a conductor 74 which is connected to ground through the current source 60. One collector of the transistor 72, or the collector of one of the transistors 72, is connected to the bottom word line 48 and the second collector is coupled to the top word line 46.

The word line recovery circuitry associated with the mid-state word lines 50 and 52 includes the NPN transistor 76, the base of which is coupled to ground through a current source 78 and to the cathode of the diode 80, the anode of which is coupled to the bottom word line 52. The emitter of transistor 76 is coupled to the conductor 68 and the collector is coupled through the resistance 82 to the bottom word line 52 and to the base of the dual-collector transistor 84, the emitter of which is coupled to the conductor 74 and the collectors of which are coupled to the top and bottom word lines 50 and 52, respectively.

The word line recovery circuitry associated with the deselected word lines 54 and 56 includes the NPN transistor 86, the base of which is coupled to ground through a current source 88 and to the cathode of diode 90, the anode of which is connected to the bottom word line 56. The collector of transistor 86 is coupled through a resistance 92 to the bottom word line 56 and to the base of the dual collector transistor 94. The emitter of transistor 86 is connected to the conductor 68 and the emitter of transistor 94 is connected to the conductor 74. The collectors of transistor 94 are connected to the top and bottom word lines 54 and 56, respectively.

An NPN transistor 96 is provided to supply current to the current source 60 in the event that no other current is flowing through the conductor 74, an event occurring when no word lines are in mid-state. The collector of transistor 96 is connected to a $V_{cc}$ source and the emitter is coupled to the conductor 74. A reference voltage is applied to the base of transistor 96 to maintain conduction in the voltage range between the dashed line 25 and the deselected level 30 of FIG. 2.

OPERATION OF THE CIRCUITRY

In summarizing the operation of the recovery circuitry two comparisons are performed by the circuitry. The first is performed by the "single collector" transistors, such as transistors 62, 76 and 86, and determines which word line in the memory is at its high level selected state. The diodes 66, 80 and 90 drop the bottom word line voltages by $1\phi$ to the base voltage levels of their respective transistors. The particular transistor thus coupled to the high selected word line (in the illustrated embodiment, transistor 62 is coupled to the bottom word line 48 of the selected word line pair) receives the highest base voltage and it conducts current to drop its emitter voltage level an additional $1\phi$. The voltage level on the emitter of this transistor 62 establishes the voltage level on the conductor 68 and thus the emitters of all other transistors 76 and 86. Since the base to emitter voltages of these other transistors 76 and 86 are below their threshold levels, they are cut off. The first comparison circuits are therefore operational in the voltage range between the dashed lines 20 and 23 of FIG. 2.

A second comparison is made by the dual-collector transistors 72, 84 and 94, which are operational in the voltage range between the dashed lines 23 and 24 of FIG. 2. The transistor receiving the highest base voltage is ON and the 1φ drop through this conducting transistor establishes the emitter voltage level for the remaining transistors which are thereby rendered non-conducting.

A detailed explanation of the operation is as follows. The bottom word line 48, associated with the selected top word line 46, is assumed to carry a voltage level of $-2.3\phi$. Current flows through diode 66 and through current source 64 to ground. Diode 66 drops the voltage level by 1φ from the selected word line voltage so that the base of transistor 62 is at $-3.3\phi$ and is conducting current through resistance 70 to the conductor 68. Since transistor 62 drops the voltage between base and emitter by 1φ, the voltage level on the conductor 68 is established by transistor 62 to be $-4.3\phi$, and this voltage level is thus applied to the emitters of transistors 76 and 86. The value of the resistance 70, as well as the corresponding resistances 82 and 92 in the remaining word line circuit, are carefully selected so that when the conducting transistor 62 is ON, the IR drop across resistance 70 will produce a voltage on the collector of that transistor of $3.8\phi$, the same voltage on the bottom deselected word line 56.

The word lines 50–52 are assumed to be in their mid-state transition with an instantaneous voltage on the top word line 50 of $-2.0\phi$ and the voltage on bottom line 52 of $3.0\phi$. After a further drop across the diode 80 on the voltage on the base of transistor 76 becomes $-4.0\phi$. As explained above, the transistor 62 associated with the selected word lines 46–48 is conducting and establishes a level of $-4.3\phi$ on the conductor 68 and all emitters coupled thereto. Thus, the transistor 76, with a base voltage of $-4.0\phi$ and emitter voltage of $-4.3\phi$, is below threshold and is OFF. Now base current at the level of $-3.0\phi$ is conducted from bottom word line 52, through resistor 82 to transistor 84 to turn ON that transistor to very rapidly discharge the falling mid-state word lines 50–52 through conductor 74 and the current source 60. The instantaneous voltage level on the conductor 74 is then dropped to $4.0\phi$ which establishes the level on the emitters of all the multi-collector transistors coupled to that conductor.

Referring back to the selected word lines 46–48 the voltage on the collector of transistor 62 and therefore the base of the multi-collector transistor 72 was found to be $-3.8\phi$. Since the voltage level on conductor 74 and hence the emitter of transistor 72 was established to be $-4.0\phi$ at the instant of consideration, the base to emitter voltage is below threshold and transistor 72 is OFF to prevent discharge of the selected word lines 46–48.

The deselected word lines 54–56 carry voltage levels of $-2.8\phi$ and $-3.8\phi$, respectively. The diode 90 drops the bottom line voltage to $-4.8\phi$ which is applied to the base of transistor 86. Since the emitter level was established by the conducting transistor 62 to be $-4.3\phi$, the transistor 86 is biased OFF. The full voltage of $-3.8\phi$ from the bottom word line 56 is now applied to the base of transistor 94, the emitter of which was established by the conducting transistor 84 to be $-4.0\phi$. Transistor 94 is therefore OFF and the voltage levels on word lines 54 and 56 remain unaffected.

I claim:

1. Discharge circuitry for rapidly discharging each of a plurality of electrical conductors when the voltage thereon drops from a first selected voltage level through a mid-state transition toward a second voltage level, said circuitry comprising:
    a plurality of first transistors each coupled in series with a resistance element being one of said plurality of conductors and a first current source conductor common to the emitters of all of said first transistors;
    control circuitry coupled to the base of each of said plurality of first transistors and to its respective electrical conductor, said control circuitry applying to said base a voltage of one $V_{be}$ below the voltage on said respective conductor, the particular first transistor of said plurality that receives the highest base voltage from its control circuitry establishing the voltage level on said first current source conductor and the emitter of each of said plurality of first transistors;
    a plurality of second transistors each coupled between one of said plurality of conductors and a second current source conductor common to the emitters of all of said second transistors, the base of each of said second transistors being coupled to the collector of a corresponding one of said first transistors, the particular second transistor of said plurality that receives the highest base voltage establishing the voltage level on said second current source conductor and the emitters of each of said plurality of second transistors.

2. The discharge circuitry claimed in claim 1 wherein said control circuitry includes a diode in series with a third current source, the anode of said diode being coupled to said conductor.

3. The discharge circuitry claimed in claim 1 further including a third transistor coupled between a voltage source and said second current source conductor, said third transistor being continuously conductive for supplying current to said second current source during periods when said second transistors are non-conductive.

4. The discharge circuitry claimed in claim 1 wherein each of said second transistors include a plurality of substantially identical transistors having interconnected bases and interconnected emitters, the collectors of each of said plurality being coupled to a separate conductor for discharging that conductor when the voltage level on said first conductor drops below said first selected voltage level.

5. The discharge circuitry claimed in claim 1 wherein each of said second transistors has a base, an emitter, and a plurality of collectors, each of said collectors being coupled to a separate conductor for discharging that conductor when the voltage level on said first conductor drops below said first selected voltage level.

6. The discharge circuitry claimed in claim 1 wherein each of said first conductors is one bottom word line of a random access memory having a plurality of top and bottom word line pairs and a plurality of memory cells in rows and coupled between each of said pairs.

7. The discharge circuitry claimed in claims 4 or 5 wherein each of said first conductor is one bottom word line of a random access memory having a plurality of top and bottom word line pairs and a plurality of memory cells in rows coupled between each of said pairs, and wherein a collector in one of said plurality of second transistors is connected to each word line in a word line pair for rapidly discharging said word line pair when the voltage on said bottom word line falls below said first selected level.

* * * * *